(12) United States Patent
Gill

(10) Patent No.: US 6,515,838 B1
(45) Date of Patent: Feb. 4, 2003

(54) BIASING CORRECTION FOR SIMPLE GMR HEAD

(75) Inventor: Hardayal Singh Gill, Portola Valley, CA (US)

(73) Assignee: International Business Machines Corporation, Armonk, NY (US)

(*) Notice: Subject to any disclaimer, the term of this patent is extended or adjusted under 35 U.S.C. 154(b) by 152 days.

(21) Appl. No.: 09/588,255

(22) Filed: Jun. 6, 2000

(51) Int. Cl.[7] ............... G11B 5/127; G11B 5/33; G11B 5/39
(52) U.S. Cl. ............................................. 360/324.12
(58) Field of Search ................... 360/324.12, 324.1, 360/324, 313, 110, 321, 324.11

(56) References Cited

U.S. PATENT DOCUMENTS

| | | | |
|---|---|---|---|
| 5,465,185 A | | 11/1995 | Heim et al. ............ 360/324.11 |
| 5,508,867 A | * | 4/1996 | Cain et al. ................ 324/252 |
| 5,705,973 A | * | 1/1998 | Yuan et al. ............ 324/207.21 |
| 5,828,529 A | | 10/1998 | Gill ........................ 360/324.11 |
| 5,892,641 A | * | 4/1999 | Ishiwata .................. 360/327.1 |
| 5,974,657 A | | 11/1999 | Fox et al. ................ 29/603.08 |
| 6,351,355 B1 | * | 2/2002 | Min et al. .............. 360/324.11 |
| 2002/0006021 A1 | * | 1/2002 | Beach .................... 360/324.11 |

* cited by examiner

Primary Examiner—Robert S. Tupper
Assistant Examiner—Julie Anne Watko
(74) Attorney, Agent, or Firm—Kunzler & Associates

(57) ABSTRACT

An spin valve sensor is provided with a ferromagnetic free layer, a ferromagnetic pinned layer, and a nonferromagnetic spacer layer separating the free layer and the pinned layer. The magneto resistance of the spin valve sensor is increased by increasing the thickness of the pinned layer. To counter a magnetic field induced in the free layer by the thicker pinned layer, a biasing layer is used. The bias layer helps achieve a desired orientation of the magnetic fields of the free layer and the pinned layer to be offset by 90 degrees in the absence of an external magnetic field. The bias layer is located to a side of the pinned layer opposite the free layer. The bias layer is selected to be magnetically soft and to have a high resistivity and may be formed of CoFe or CoHfNbFe. The thickness of the bias layer is selected to be approximately equivalent to the increase in thickness of the free layer from a previously biased amount.

19 Claims, 6 Drawing Sheets

BIASING CORRECTION FOR SIMPLE GMR HEAD

BACKGROUND OF THE INVENTION

1. The Field of the Invention

This invention relates generally to spin valve magnetic transducers for reading information signals from a magnetic medium and, in particular, to increasing the thickness of a pinned layer for a spin valve sensor, and to magnetic recording systems which incorporate such sensors.

2. The Relevant Technology

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor, more recently developed, is the giant magneto resistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using two layers of ferromagnetic material separated by a layer of non-magnetic electrically conductive material are generally referred to as spin valve (SV) sensors manifesting the GMR effect. In an SV sensor, one of the ferromagnetic layers, referred to as the pinned layer, has its magnetization typically pinned by exchange coupling with an antiferromagnetic (e.g., NiO or Fe—Mn) layer.

The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the SV sensor and a corresponding change in the sensed current or voltage.

FIG. 1 shows a simple SV sensor 100 comprising a pair of end regions 104 separated by a central region 102. The central region 102 is formed by a suitable method such as sputtering onto a substrate 105 and has defined end regions that are contiguous with and abut the edges of the central region. A free layer (free ferromagnetic layer) 110 is separated from a pinned layer (pinned ferromagnetic layer) 120 by a non-magnetic, electrically-conducting spacer 112. The magnetization of the pinned layer 114 is fixed through exchange coupling with an anti ferromagnetic (AFM) layer 116.

A seed layer 109, the free layer 110, a spacer 112 the pinned layer 114, the AFM layer 116, and the cap layer 118 are all formed in the central region 102. Hard bias layers 120, formed in the end regions 104, provide longitudinal bias for the free layer 110. Leads 122 formed over the hard bias layers 120 provide electrical connections for the flow of the sensing current $I_S$ from a current source 124 to the MR sensor 100. A sensing device 126 connected to the leads 122 senses the change in the resistance of the free layer 110 and the pinned layer 114 due to changes induced by an external magnetic field such as the field generated by a data bit stored on a disk drive media. IBM's U.S. Pat. No. 5,206,590 granted to Dieny et al. and incorporated herein by reference, discloses a GMR sensor operating on the basis of the SV effect.

One key to proper operation of a spin valve sensor is properly biasing the magnetization of the free layer so that the magnetization of the pinned and free layers are oriented in the manner shown in FIG. 1 FIG. 2 shows the simple GMR spin valve sensor 100 of FIG. 1 rotated 90 degrees. The spin valve sensor 100 of FIG. 2 is shown with the air bearing surface at the bottom of the drawing (not shown). Seen in FIG. 2 are various magnetic fields of a properly biased spin valve sensor 100. The current $I_S$ passing through the sensor 100 is directed between the leads 106 (not shown) in a direction 125 coming out of the page. The magnetization $M_P$ from the pinned layer 114 is pinned through exchange coupling with the AFM in a direction 128 pointing down in the free layer 110.

The magnetization $M_P$ of the pinned layer 114 induces a demagnetizing field $H_D$ through the free layer 110 with an orientation 132 pointing up. A field Hc also results from magnetic coupling between the pinned layer 114 and the free layer 110. The magnetic coupling field Hc has a direction 134 going down in FIG. 2. A field His is induced within the free layer 110 as a result of the current $I_S$ and has a direction 130 acting downward through the free layer. As a result of the biasing through the cumulation of the fields in the sensor (including biasing from the hard bias layers 120), the free layer 110 has a resultant magnetization $M_F$ oriented with a direction 130 acting perpendicular to the direction 128 of the magnetization $M_P$ of the pinned layer 114. Preferably, the magnetization $M_F$ has a direction pointing either into or out of the page. In the depicted sensor 100, the magnetization $M_F$ has a direction 130 pointing out of the page.

In this arrangement, where the magnetization $M_F$ in the free layer 110 and the magnetization $M_P$ in the pinned layer 114 are perpendicular to each other, the external magnetic field from the magnetized bits of the disk drive cause the magnetization $M_F$ to rotate (or "spin") to a direction pointing either up or down depending on the value of the stored bit. For instance, an external magnetic field indicating a zero may have a direction causing the magnetization $M_F$ to rotate down to a direction parallel to the magnetization Mp, resulting in a low resistance condition in the sensor 100. An external magnetic field indicating a one may have a direction causing the magnetization Mp to rotate up to a position antiparallel to the magnetization Mp, resulting in a high resistance condition in the sensor 100.

When the magnetizations $M_P$ and $M_F$ are parallel, less electrons are scattered (ostensibly because only electrons with a spin in one direction are affected by the fields) and when the magnetizations $M_P$ and $M_F$ are antiparallel, more electrons are scattered (because electrons of both spin types are affected), causing a higher resistance condition. By monitoring these high and low resistance conditions, the applied external magnetic fields representing ones and zeroes on the disk drive media can be properly detected by the sensing device 126 even at the higher densities becoming more common in current disk drives. on any given disk surface. In so doing, it has been found that increasing the thickness of the pinned layer can lead to an increase in the magnetoresistance (dR/R) of the sensor. A thicker pinned layer causes a reduction in boundary scattering, which in turn results in greater magnetoresistance of the sensor.

Nevertheless, increasing the thickness of the pinned layer has been found to increase the demagnetizing field $H_D$ and consequently alter the bias of the aforementioned magnetic fields within the free layer. This altered bias in turn causes a negative asymmetry of the read signal. Symmetry of the read signal of the spin valve sensor is determined by the orientation of the magnetic fields His and magnetizations Mp of the free and pinned layers. When the pinned layer is increased in prior art spin valve sensors, the signal asymmetry increases such that the sensing device 126 cannot properly detect the changes in resistance.

One manner in which the prior art has attempted to correct the bias of a spin valve sensor when increasing the thickness of the pinned layer is with the use of a keeper layer. Referring to FIG. 3, shown therein is a partial cross-sectional view of a prior art simple spin valve sensor 150 having a keeper layer 152 of the prior art. The spin valve sensor 150 is configured substantially in the same manner as the spin valve sensor 100 of FIGS. 1 and 2, with the exception of the added keeper layer 152 and a spacer layer 154.

The keeper layer, when thicker than the pinned layer, produces a demagnetization field Hk in the free layer that partially opposes the increased demagnetizing field $H_D$ from thicker pinned layer. The result is a more properly biased simple spin valve sensor with a thicker pinned layer. The increase in the thickness of the keeper layer 152 to create the proper bias must be substantially in excess of the increase in the thickness of the pinned layer. A thick keeper layer is problematic because it results in a high amount of shunting of the current $I_S$ through the keeper layer 152. This current shunting reduces the current flowing through the pinned and free layers and consequently reduces the magnetoresistance of the sensor.

Thus, it can be seen from the above discussion that there is a need existing in the art for an improved spin valve sensor with an increased magnetoresistance. Particularly, it would be advantageous to provide a spin valve sensor achieving an increased magnetoresistance through increasing the thickness of the pinned layer, while maintaining a proper biasing without a corresponding increase of current shunting.

OBJECTS AND BRIEF SUMMARY OF THE INVENTION

The apparatus of the present invention has been developed in response to the present state of the art, and in particular, in response to the problems and needs in the art that have not yet been fully solved by currently available spin valve sensors. Thus, it is an overall objective of the present invention to provide an improved spin valve sensor with an increased magnetoresistance through an increased pinned layer thickness.

To achieve the foregoing object, and in accordance with the invention as embodied and broadly described herein in the preferred embodiments, a spin valve sensor with a thicker pinned layer is provided. The spin valve sensor maintains a proper bias of the magnetization in the free layer through the use of a bias layer disposed to a side of the pinned layer opposite the free layer.

The spin valve sensor of the present invention in one embodiment comprises a free layer formed of a first ferromagnetic material; a pinned layer formed of a second ferromagnetic material; a spacer layer interposed between the free layer and the pinned layer, the spacer layer formed of a nonferromagnetic conducting material; and a bias layer located to a side of the pinned layer opposite the free layer, the bias layer configured to at least partially bias the magnetization of the free layer.

The spin valve sensor may also comprise an AFM layer exchange coupled with the pinned layer. The AFM layer is preferably disposed to a side of the pinned layer opposite the free layer. The spin valve sensor may also comprise a substrate. Preferably, the free layer, the pinned layer, the spacer layer, and the bias layer are formed on the substrate. A cap layer is preferably formed atop the stack of the aforementioned layers.

In one embodiment, the AFM layer is located adjacent to the pinned layer, and a spacer layer is interposed between the AFM layer and the bias layer. The spacer layer is preferably formed substantially of tantalum. The pinned layer is preferably formed of a Co and Fe alloy.

The bias layer may comprise a Co and Fe alloy, and the Co and Fe alloy may also comprise Hf and Nb. In one embodiment, the bias layer has a thickness substantially equivalent to the thickness of the free layer above 25 angstroms. The bias layer may have a thickness in a range of between about 10 and about 30 Angstroms. In a preferred embodiment, the bias layer has a thickness of about 25 Angstroms.

In one embodiment, the pinned layer has a thickness in a range of between about 40 and 50 Angstroms and the bias layer has a thickness in a range of about between about 15 and 25 Angstroms. The AFM layer may be formed of a material selected from a group consisting of PtMn, IrMn, and NiMn. The pinned layer may be formed with a thickness in a range of between about 30 and about 60 Angstroms. Alternatively, the pinned layer may be formed with a thickness in a range of between about 40 and about 50 angstroms.

The bias layer is preferably situated to produce a magnetic field as a result of a current applied to the spin valve sensor. The magnetic field of the bias layer preferably opposes and partially cancels a demagnetizing field created within the free layer by the magnetization of the pinned layer. Preferably, the magnetic field of the bias layer is oriented in a direction causing the magnetization of the free layer to be oriented in a direction substantially perpendicular to an orientation of a magnetization of the pinned layer in the absence of an applied external magnetic field. Thus, the pinned layer is preferably formed with a thickness greater than about 30 angstroms while the magnetization within the free layer exhibit substantially no asymmetry.

The spin valve sensor of the present invention may be incorporated within a disk drive system comprising a magnetic recording disk; a spin valve (SV) sensor configured in the manner discussed above; an actuator for moving said spin valve sensor across the magnetic recording disk so the spin valve sensor may access different regions of magnetically recorded data on the magnetic disk drive media; and a detector electrically coupled to the spin valve sensor for detecting changes in resistance of the sensor caused by rotation of the magnetization axis of the free ferromagnetic layer relative to the fixed magnetizations of the AP-pinned layer in response to magnetic fields from the magnetically recorded data.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 4:
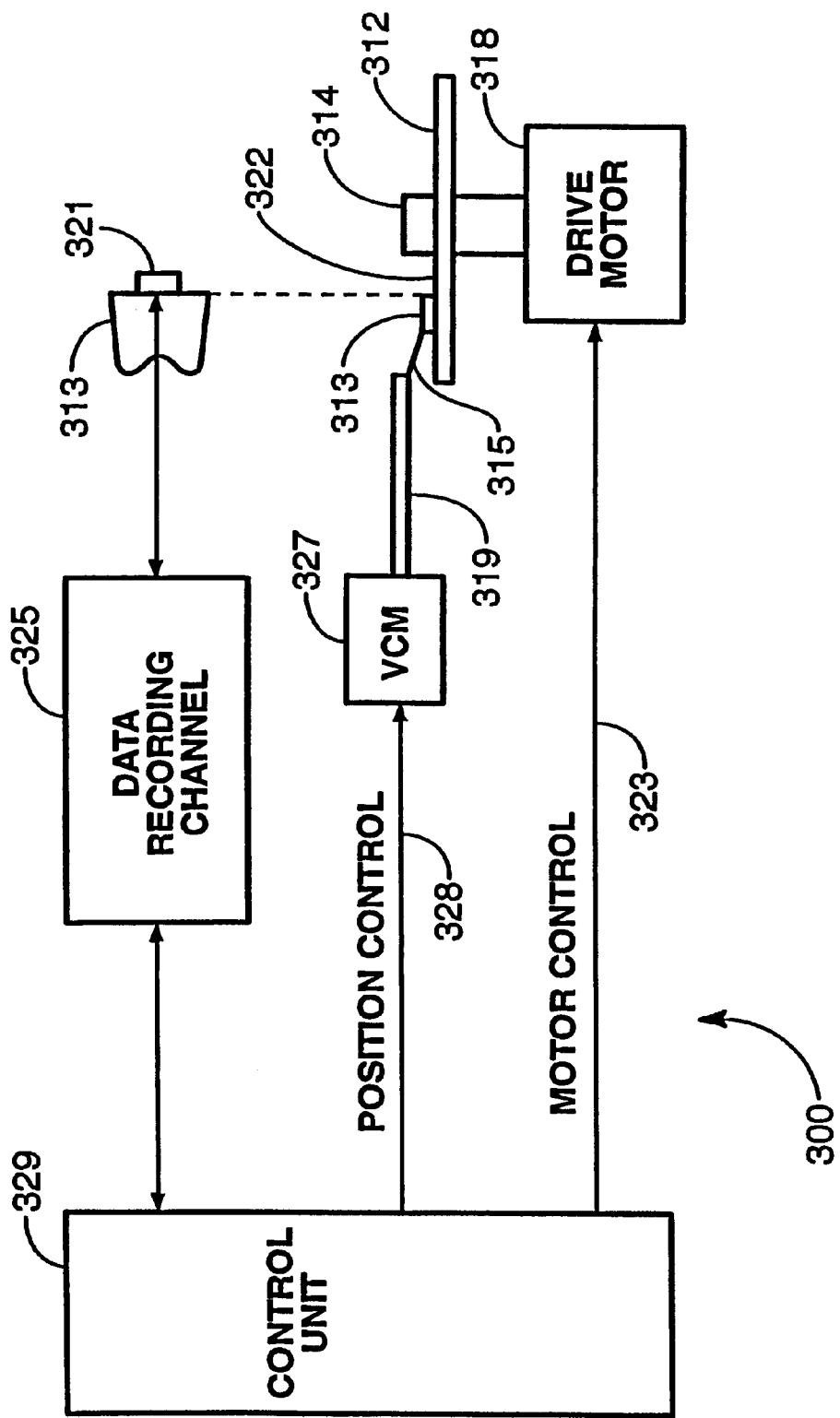
FIG. 4 is a schematic block diagram illustrating one embodiment of a magnetic recording disk drive system of the present invention.

FIG. 4 shows one example of a disk drive 300 embodying the present invention. As shown in FIG. 4, the disk drive 300 comprises at least one rotatable magnetic disk 312 supported on a spindle 314 and rotated by a disk drive motor 318. The magnetic recording media on each magnetic disk 312 is in the form of an annular pattern of concentric data tracks (not shown).

At least one slider 313 is positioned on the disk 312. Each slider 313 supports one or more magnetic read/write heads 321 incorporating the GMR sensor of the present invention. As the disks rotate, the slider 313 is moved radially in and out over the disk surface 322 so that the heads 321 may access different portions of the magnetic disk 312 where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator means 327.

The actuator means as shown in FIG. 4 may be a voice coil motor (VCM). The VCM comprises a coil movable within a fixed magnetic field, the direction and speed of the coil movements being controlled by the motor current signals supplied by a controller 329.

During operation of the disk storage system, the rotation of the magnetic disk 312 generates an air bearing between the slider 313 (the surface of slider 313 which includes the head 321 and faces the surface of disk 312 is referred to as an air bearing surface (ABS)) and the disk surface 322 which exerts an upward force or lift on the slider 313. The air bearing thus counter-balances the slight spring force of the suspension 315 and supports the slider 313 off and slightly above the disk surface by a small, substantially constant spacing during operation.

The various components of the disk storage system are controlled in operation by control signals generated by the control unit 329, such as access control signals and internal clock signals. Typically, the control unit 329 comprises logic control circuits, storage means and a microprocessor. The control unit 329 generates control signals to control various system operations such as drive motor control signals on a line 323 and head position and seek control signals on a line 328. The control signals on the line 328 provide the desired current profiles to optimally move and position the slider 313 to the desired data track on the disk 312. Read and write signals are communicated to and from the read/write heads 321 by means of a recording channel 325. In the depicted embodiment, the read/write heads 321 incorporate a GMR sensor including a spin valve of the present invention.

Figure 5:
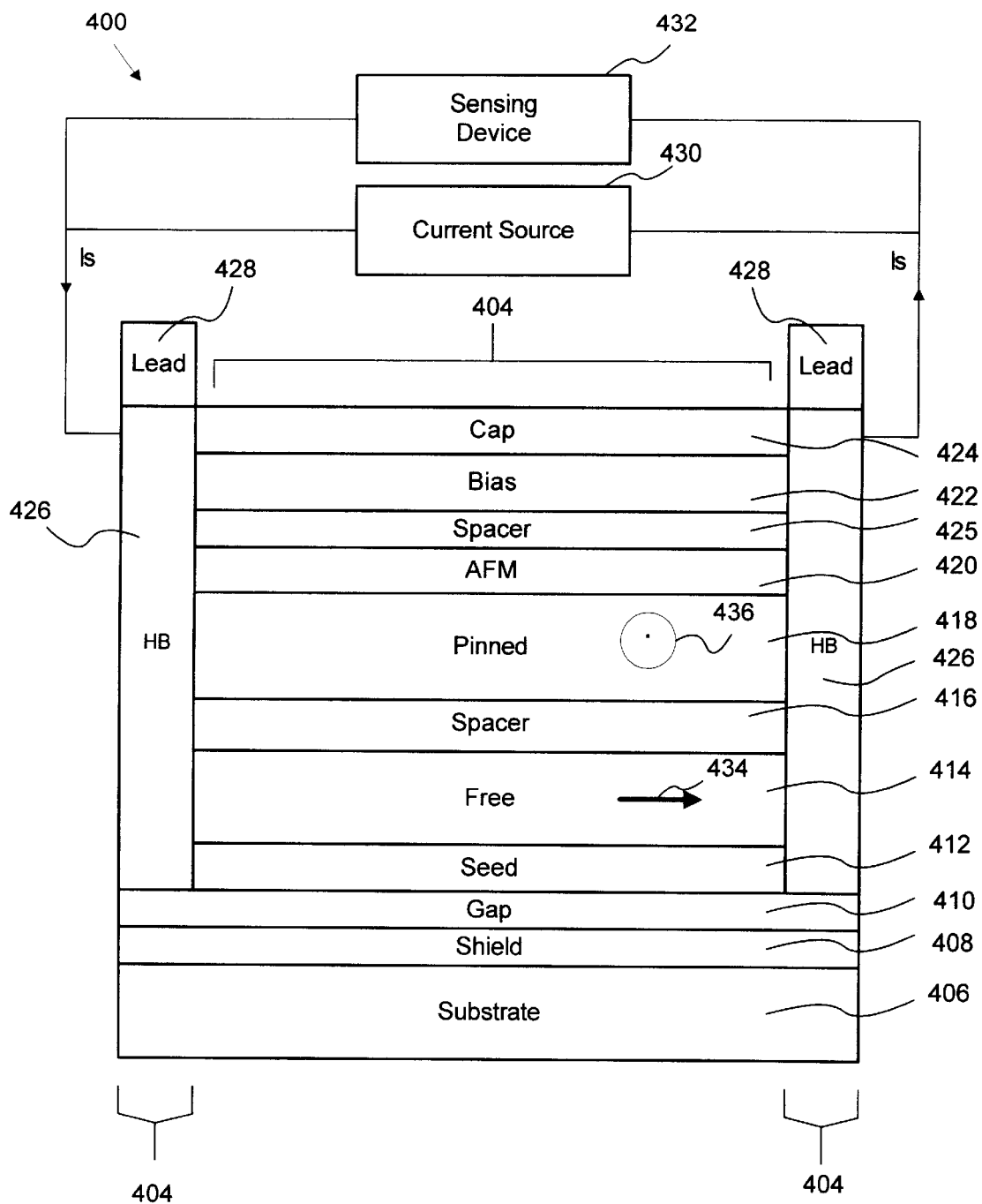
FIG. 5 is a cross-sectional view illustrating the composition of one embodiment of a spin valve sensor of the present invention.
Figure 6:
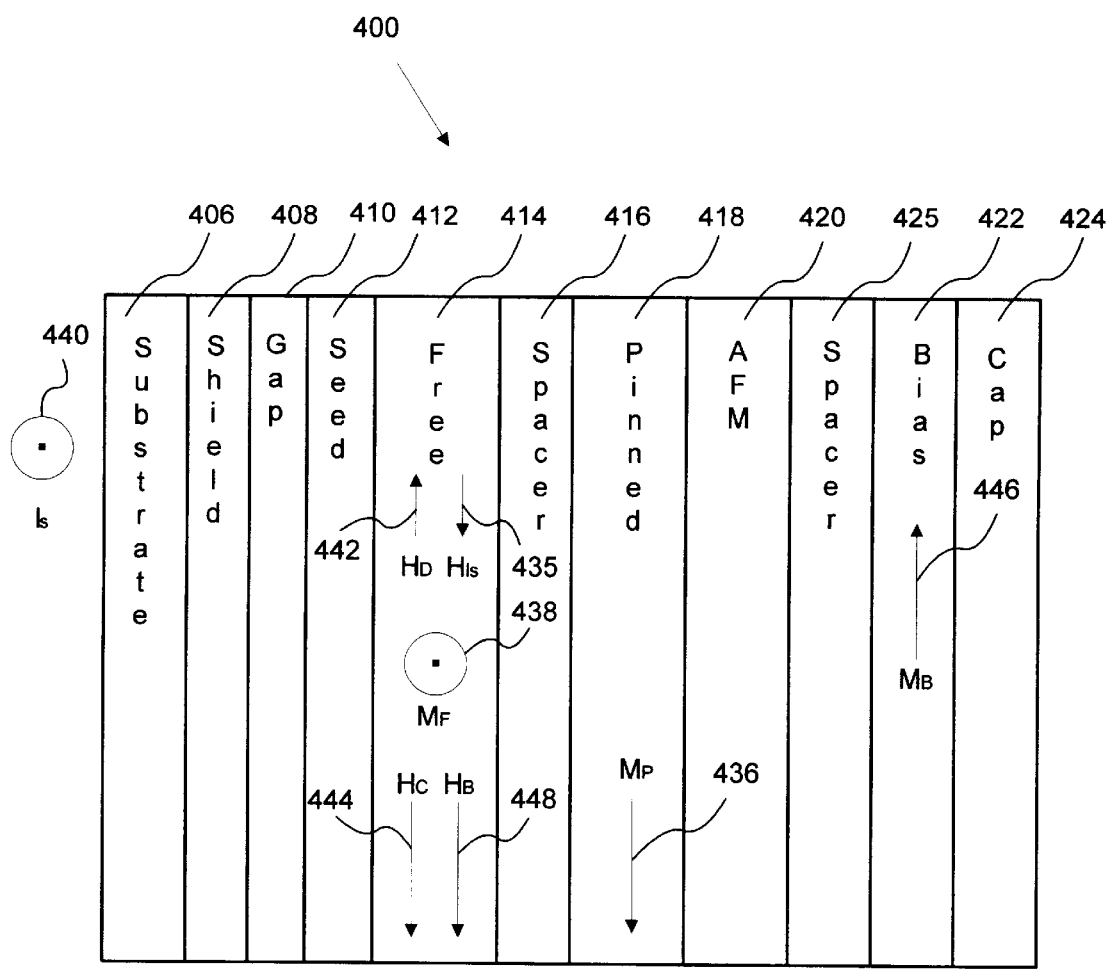
FIG. 6 is a cross-sectional view illustrating the spin valve sensor of FIG. 5 with the view rotated 90 degrees.

FIGS. 5 and 6 depict the composition of one embodiment of a preferred spin valve 400 of the present invention including a thicker pinned layer and a bias layer. FIG. 5 shows an air bearing surface (ABS) view of the SV sensor 400 according to one embodiment of the present invention. While a top GMR structure with the AFM on top of the stack of layers is depicted, a bottom GMR structure with the AFM on bottom of the stack could also be used with the present invention.

The spin valve sensor 400 of FIG. 5 is shown with a pair of end regions 402 separated from each other by a central region 404. The central region 404 has defined edges where the end regions 402 form a contiguous junction with and abut said edges. The sensor 400 is built upon a substrate 406, which may be any suitable substance, including glass, semiconductor material, or a ceramic material, such as alumina ($Al_2O_3$).

The spin valve sensor 400 may also comprise a shield layer 408 and a gap layer 410 as is known to those skilled in the art. A seed layer 412 may be provided to help orient the crystalline structure grown above it. Shown above the seed layer 412 is a free layer 414. The free layer 414 is preferably formed of a material having a high magnetoresistance such as Co of CoFe. Above the free layer 414 is shown a spacer layer 416. In one embodiment, the spacer layer 416 is formed of a conducting, nonferromagnetic material such as copper.

A pinned layer 418 is formed above the spacer layer. Preferably, the pinned layer 418 is formed of a magnetoresistive material such as Co or CoFe. An antiferromagnetic (AFM) layer 420 is formed over the pinned layer 418 in the central region 404. The AFM layer 420 is, in one embodiment, formed of PtMn, although it may also be formed of other types of antiferromagnetic material such as a Mn alloys, including NiMn. The pinned layer 418 pins the direction 436 of magnetization of the pinned layer 418 through exchange coupling. In the depicted embodiment, the magnetization of the pinned layer 418 is pinned in a direction coming out of the page.

In accordance with the present invention, in order to allow the formation of a thicker pinned layer 418, a bias layer 422 and a spacer layer 425 are formed on a side of the pinned layer opposite the free layer 414. In the depicted embodiment, the spacer layer 425 is formed above the AFM layer 420, and the bias layer 422 is formed above the spacer layer 425.

In one embodiment, the spacer layer 425 is formed of Ta and the bias layer 422 is formed of a material such as CoFe or CoHfNbFe. The spacer layer 425 is preferably formed with a thickness of about 20 Angstroms. The bias layer 422 is preferably formed with a thickness selected to counter the increased demagnetization field of thicker pinned layer. Thus, the bias layer 422 preferably causes a biasing of the magnetization of the free layer 414 such that the free layer 414 has a magnetization with a direction 434 parallel to the ABS. Alternatively, the direction 434 could be directed to the left. Typically, the bias layer 422 is selected to have a thickness corresponding to an increased thickness of the pinned layer 418 in excess of a previously biased thickness.

As an example, current pinned layers 418 are currently thought to be properly biasable when having a thickness of about 25 Angstroms. If the thickness of the pinned layer is increased from this properly biasable thickness to a thickness of, for instance, 40 Angstroms, the bias layer 422 is selected to have a thickness of about 15 Angstroms.

Currently, it is preferred to increase the thickness of the pinned layer to a thickness in a range of between about 30 to 50 Angstroms. At thicknesses in excess of 50 Angstroms, excess current shunting through the pinned layer occurs. A more preferred thickness is in a range of between about 40 to 45 Angstroms, and a thickness of about 45 Angstroms is currently most preferred. Thus, for the preferred pinned layer thickness of 45 Angstroms, the bias layer may have a thickness of about 20 Angstroms. Of course, thicknesses may vary according to the particular configuration of the other layers, but the principle of increasing the thickness of the bias layer 422 concurrently with increasing the thickness of the pinned layer 418 in order to properly bias the magnetization in the free layer 414 is a constant overriding factor of the present invention.

A pair of electrical leads 428 are also shown formed over the biasing layers 426 and are employed to form a circuit path between the spin valve sensor 400 and a current source 430 and a sensing device 432. In the preferred embodiment, magnetic signals in the recorded medium (e.g., the disk 312 of FIG. 4) are sensed by the sensing device 432 in the form of a voltage differential (voltage signal) between the two leads 428.

The sensed voltage signal arises from a change in resistance, $\Delta R$, of the central portion 404 as the direction of the magnetic field $H_{fs}$ of the free layer 420 rotates in response to the applied external magnetic signal from the recorded medium. The sensing device 432 may include a digital recording channel such as a partial-response maximum likelihood (PRML) channel as is known to those skilled in the art. Alternatively, it may include a peakdetect channel as is known to those skilled in the art. In the preferred embodiment of the present invention, the sensing device includes a digital recording channel of the type known in the art as partial-response maximum-likelihood.

FIG. 6 shows the sensor 400 of FIG. 5 rotated 90 degrees such that the ABS is at the bottom of the page, and the view looks through the bard bias layers 426. FIG. 6 shows a magnetization $M_B$ induced within the bias layer 422 in a direction 446 pointing up. The magnetization $M_B$ is directly induced by the current $I_S$, which flows through the sensor 400 in the direction 440 shown as coming out of the page. The flux of the magnetic field $H_D$ returns through the free layer 414 in a direction 448 shown pointing down. The downward pointing magnetic field $H_B$ offsets the increased demagnetizing field $H_D$ generated by the increased-thickness pinned layer 418. Thus, the offsetting bias layer field $H_B$ results in a cumulative magnetization $M_F$ in the free layer with a direction 438 perpendicular to the ABS (shown directed out of the page in FIG. 6).

A symmetrical configuration results, with the directions of the magnetization of the free layer 414 and the pinned layer 418 perpendicular to each other. Thus, when the applied magnetic signal from the recording medium is encountered, the swing of the magnetization $M_F$ is substantially equal in each direction, resulting in a desired symmetry.

From the above-discussion, it should be readily apparent that the improved free layer of the present invention provides the advantages of increased magnetoresistance through a thicker pinned layer while maintaining a proper bias of hte magnetic fields within the free layer and without excess current shunting.

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spin valve sensor, comprising:
   a free layer formed of a first ferromagnetic material;
   a pinned layer formed of a second ferromagnetic material;
   a spacer layer interposed between the free layer and the pinned layer, the spacer layer formed of a nonferromagnetic conducting material; and
   a bias layer located to a side of the pinned layer opposite the free layer, the bias layer comprising a Co, Fe, Hf, and Nb alloy configured to at least partially bias the magnetization of the free layer.

2. The spin valve sensor of claim 1, further comprising an AFM layer exchange coupled with the pinned layer.

3. The spin valve sensor of claim 2, wherein the AFM layer is located adjacent to the pinned layer, and further comprising a spacer layer interposed between the AFM layer and the bias layer.

4. The spin valve sensor of claim 3, wherein the spacer layer is formed substantially of tantalum.

5. The spin valve sensor of claim 1, further comprising a substrate, the free layer, pinned layer, spacer layer, and bias layer formed on the substrate, and a cap layer disposed adjacent the bias layer, opposite the substrate.

6. The spin valve sensor of claim 1, wherein the bias layer has a thickness substantially equivalent to the thickness of the free layer in excess of 25 angstroms.

7. The spin valve sensor of claim 1, wherein the bias layer has a thickness in a range of between about 10 and about 30 Angstroms.

8. The spin valve sensor of claim 1, wherein the bias layer has a thickness of about 25 Angstroms.

9. The spin valve sensor of claim 1, wherein the pinned layer has a thickness in a range of between about 40 and 50

Angstroms and the bias layer has a thickness in a range of about between about 15 and 25 Angstroms.

10. The spin valve sensor of claim 1, wherein the AFM layer is formed of a material selected from the group consisting of PtMn, IrMn, and NiMn.

11. The spin valve sensor of claim 1, wherein the pinned layer is formed with a thickness in a range of between about 30 and 60 Angstroms.

12. The spin valve sensor of claim 1, wherein the pinned layer is formed with a thickness in a range of between about 40 and about 50 angstroms.

13. The spin valve sensor of claim 1, wherein the pinned layer is formed from a Co and Fe alloy.

14. The spin valve sensor of claim 1, wherein the bias layer is situated to produce a magnetic field as a result of a current applied to the spin valve sensor, the magnetic field of the bias layer opposing and partially canceling a demagnetizing field created within the free layer by the magnetization of the pinned layer.

15. The spin valve sensor of claim 14, wherein the magnetic field of the bias layer is oriented in a direction causing the magnetic field of the free layer to be oriented in a direction substantially perpendicular to an orientation of a magnetic field of the pinned layer in the absence of an applied external magnetic field.

16. The spin valve sensor of claim 1, wherein the pinned layer is formed with a thickness greater than about 30 angstroms and the magnetic field within the free layer exhibits substantial symmetry.

17. A disk drive system, comprising:
   a magnetic recording disk;
   a spin valve sensor for reading data recorded on the recording disk, comprising:
      a free layer formed of a first ferromagnetic material;
      a pinned layer formed of a second ferromagnetic material;
      a spacer layer interposed between the free layer and the pinned layer, the spacer layer formed of a nonferromagnetic conducting material; and
      a bias layer located to a side of the pinned layer opposite the free layer, the bias layer comprising a Co, Fe, Hf, and Nb alloy configured to at least partially bias the magnetization of the free layer;
   an actuator for moving said spin valve sensor across the magnetic recording disk so the spin valve sensor may access different regions of magnetically recorded data on the magnetic recording disk; and
   a detector electrically coupled to the spin valve sensor for detecting changes in resistance of the sensor caused by rotation of the magnetization axis of the free ferromagnetic layer relative to the fixed magnetizations of the pinned layer in response to magnetic fields from the magnetically recorded data.

18. The disk drive system of claim 17, wherein the bias layer is situated to produce a magnetic field as a result of a current applied to the spin valve sensor, the magnetic field of the bias layer opposing and partially canceling a demagnetization field created within the free layer by the magnetization of the pinned layer.

19. The disk drive system of claim 17, wherein the magnetization field of the bias layer is oriented in a direction causing the magnetization of the free layer to have a direction substantially perpendicular to a direction of a magnetization of the pinned layer in the absence of an applied external field.

* * * * *

UNITED STATES PATENT AND TRADEMARK OFFICE
CERTIFICATE OF CORRECTION

Figure 1:
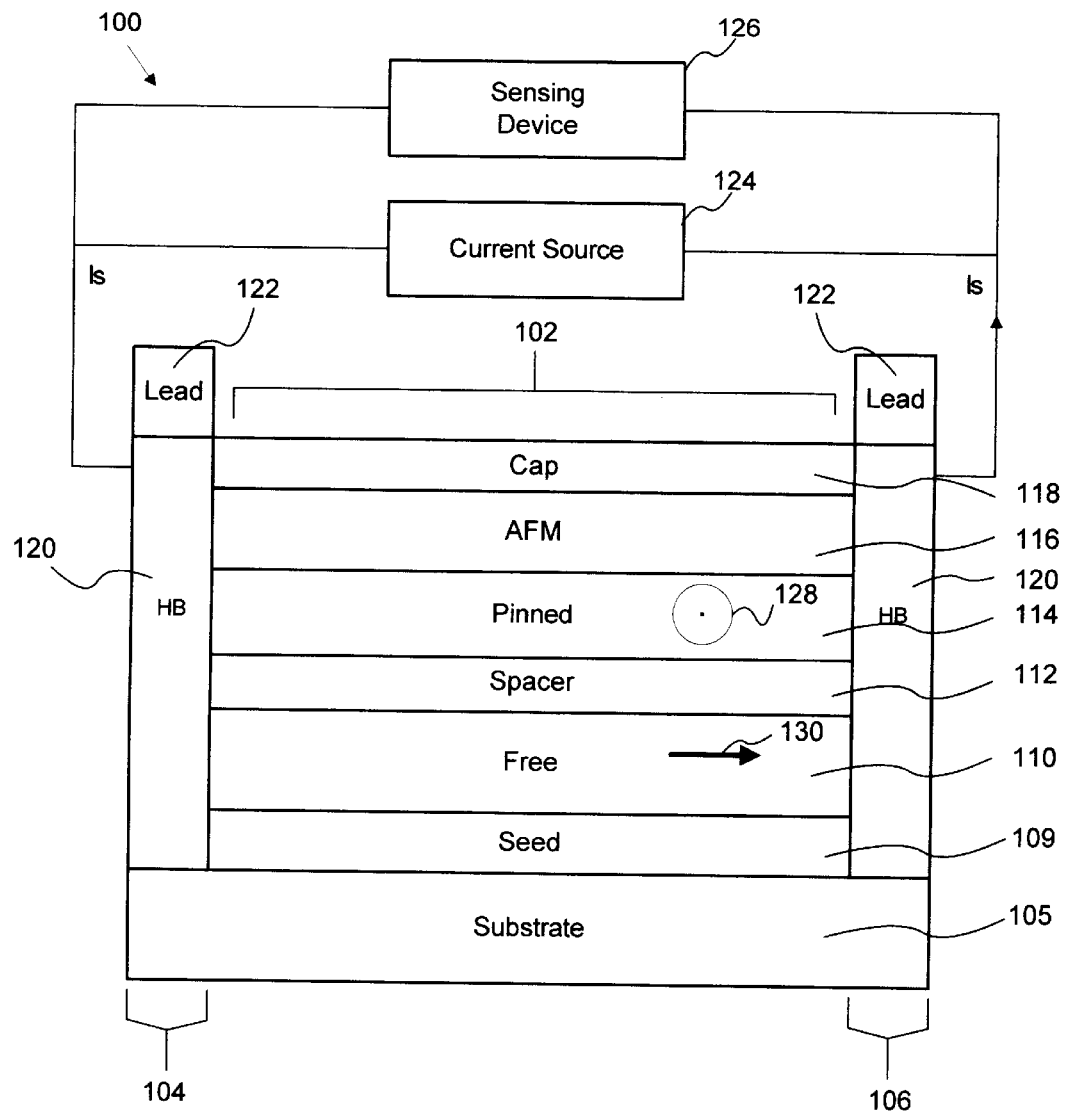
FIG. 1 is a cross-sectional view illustrating the composition of a spin valve sensor of the prior art.
Figure 2:
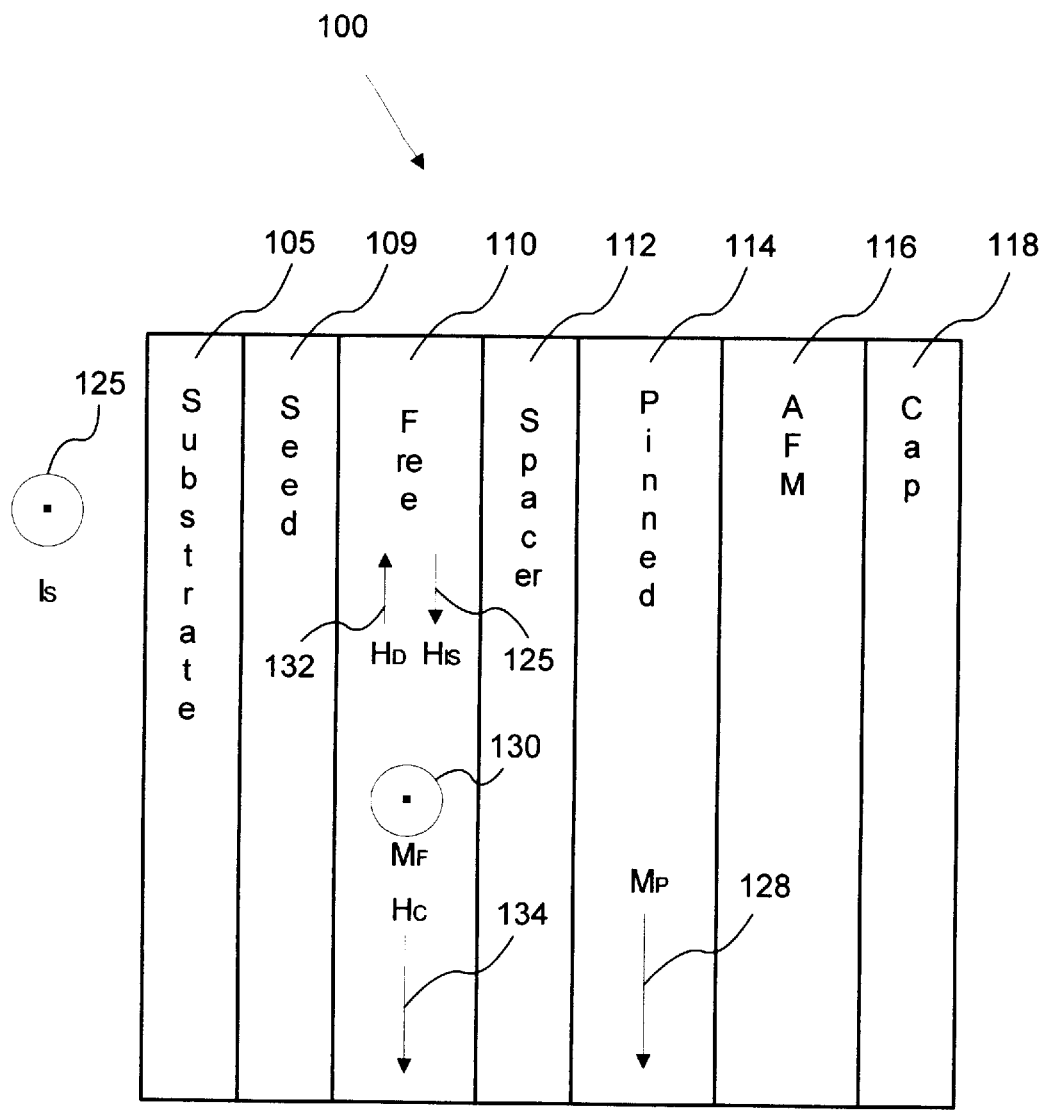
FIG. 2 is a cross-sectional view illustrating the spin valve sensor of FIG. 1 with the view rotated 90 degrees.
Figure 3:
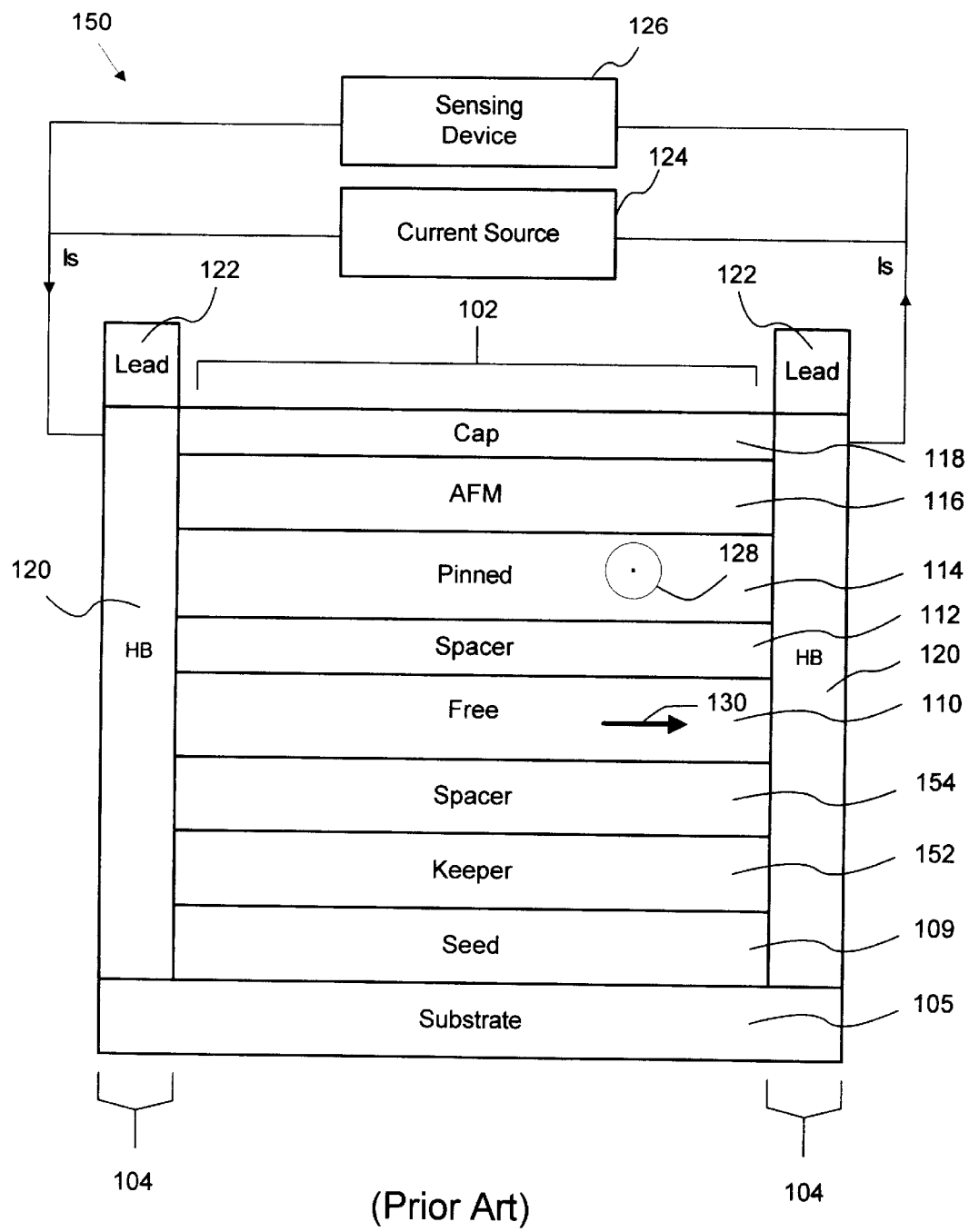
FIG. 3 is a cross-sectional view illustrating the composition of a spin valve sensor of the prior art incorporating a keeper layer.

PATENT NO.   : 6,515,838 B1  
DATED        : February 4, 2003  
INVENTOR(S)  : Hardayal Singh Gill It is certified that error appears in the above-identified patent and that said Letters Patent is hereby corrected as shown below:

Drawings,  
Figure 1, "106" should read -- 104 --.  
Figure 2, "125" marking the current direction in the free layer 110 should read -- 123 --.  
Figure 5, "404" marking both end regions shown at the bottom of the figure should read -- 402 --.

Column 2,  
Line 11, "120" should read -- 114 --.  
Line 16, "spacer 112" should read -- spacer 112, --.  
Line 34, "FIG. 1 FIG. 2" should read -- FIG. 1  FIG 2 --.  
Line 40, "leads 106" should read -- leads 122 --.  
Lines 47 and 49, "Hc" should read -- $H_C$ --.  
Line 50, "His" should read -- $H_{IS}$ --.  
Line 52, "130" should read -- 123 --.

Column 3,  
Lines 3, 6 and 7, "Mp" should read -- $M_P$ --.  
Line 19, "drives. On" should read -- drives. (New paragraph) The disk drive industry has been engaged in an ongoing effort to increase the GMR coefficient of the SV sensors in order to densify and store more and more bits of information on --.  
Line 31, "His" should read -- $H_{IS}$ --.  
Line 32, "Mp" should read -- $M_P$ --.  
Line 47, "Hk" should read -- $H_K$ --.

Column 4,  
Line 46, "of about between" should read -- of between --.

Column 6,  
Line 58, "layer418" should read -- layer 418 --.

Column 7,  
Line 55, "free layer 420" should read -- free layer 414 --.

UNITED STATES PATENT AND TRADEMARK OFFICE
CERTIFICATE OF CORRECTION

PATENT NO.   : 6,515,838 B1
DATED          : February 4, 2003
INVENTOR(S) : Hardayal Singh Gill It is certified that error appears in the above-identified patent and that said Letters Patent is hereby corrected as shown below:

Column 8,
Line 1, "bard" should read -- hard --.
Line 24, "hte" should read -- the --.

Column 9,
Line 2, "about between" should read -- between --.

Signed and Sealed this

Twenty-fourth Day of June, 2003

JAMES E. ROGAN
*Director of the United States Patent and Trademark Office*